(12) United States Patent
Ryu et al.

(10) Patent No.: US 8,096,847 B2
(45) Date of Patent: Jan. 17, 2012

(54) FLAT PANEL DISPLAY WITH HIGH EFFICIENCY AND METHOD OF FABRICATING THE SAME

(75) Inventors: Seoung-Yoon Ryu, Seoul (KR);
Seung-Yong Song, Yongin-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 0 days.

(21) Appl. No.: 12/882,442

(22) Filed: Sep. 15, 2010

(65) Prior Publication Data

US 2011/0003406 A1 Jan. 6, 2011

Related U.S. Application Data

(62) Division of application No. 10/896,011, filed on Jul. 22, 2004, now Pat. No. 7,816,857.

(30) Foreign Application Priority Data

Jul. 26, 2003 (KR) .................. 10-2003-0051811

(51) Int. Cl.
*H01L 51/00* (2006.01)

(52) U.S. Cl. ........................... 445/24; 313/504

(58) Field of Classification Search ........... 313/498–512; 345/36.45, 76; 315/169.3; 445/24–25
See application file for complete search history.

(56) References Cited

U.S. PATENT DOCUMENTS

| 5,059,861 A | 10/1991 | Littman et al. |
| 5,073,446 A | 12/1991 | Scozzafava et al. |
| 6,198,092 B1 | 3/2001 | Bulovic et al. |
| 6,534,202 B2 | 3/2003 | Sato |
| 6,541,130 B2 | 4/2003 | Fukuda |

| 2002/0037429 A1 | 3/2002 | Sato et al. |
| 2002/0180349 A1* | 12/2002 | Aziz et al. ............ 313/506 |
| 2003/0044639 A1 | 3/2003 | Fukuda |
| 2004/0061121 A1 | 4/2004 | Uchida |

FOREIGN PATENT DOCUMENTS

| CN | 1367938 | 9/2002 |
| CN | 1477911 | 2/2004 |
| KR | 10-2003-0058155 | 7/2003 |

OTHER PUBLICATIONS

Non-Final Office Action of U.S. Appl. No. 10/896,011 issued on Nov. 21, 2006.
Final Office Action of U.S. Appl. No. 10/896,011 issued on May 18, 2007.
Non-Final Office Action of U.S. Appl. No. 10/896,011 issued on Dec. 17, 2007. Non-Final Office Action of U.S. Appl. No. 10/896,011 issued on Jul. 10, 2008.
Final Office Action of U.S. Appl. No. 10/896,011 issued on Jan. 26, 2009.
Non-Final Office Action of U.S. Appl. No. 10/896,011 issued on Jun. 22, 2009.
Final Office Action of U.S. Appl. No. 10/896,011 issued on Dec. 28, 2009.
Notice of Allowance of U.S. Appl. No. 10/896,011 issued on Jun. 14, 2010.

* cited by examiner

*Primary Examiner* — Anne Hines
(74) *Attorney, Agent, or Firm* — H.C. Park & Associates, PLC

(57) ABSTRACT

An organic light emitting device is disclosed. In one embodiment, the organic light emitting device includes red (R), green (G) and blue (B) lower electrodes formed on a substrate. R, G, B organic thin film layers are formed on the R, G, B lower electrodes, respectively. Additionally, an upper single or multilayer electrode is formed over the substrate. Portions of the upper electrode that correspond to the R, G, B organic thin film layers, respectively, are formed to each have a different thickness. Various methods for forming the upper electrode using a fine metal mask, a halftone mask, and single and multiple photolithography processes are also disclosed.

10 Claims, 14 Drawing Sheets

FLAT PANEL DISPLAY WITH HIGH EFFICIENCY AND METHOD OF FABRICATING THE SAME

CROSS-REFERENCE TO RELATED APPLICATIONS

This application is a divisional of U.S. application Ser. No. 10/896,011 filed on Jul. 22, 2004 and claims priority from and the benefit of Korean Patent Application No. 2003-51811, filed on Jul. 26, 2003, which are hereby incorporated by reference for all purposes as if fully set forth herein.

BACKGROUND OF THE INVENTION

1. Field of the Invention

The present invention generally relates to a flat panel display and, more particularly, to a flat panel display having a high efficiency in which a cathode electrode has a different thickness for each of red (R), green (G), and blue (B) pixels, and a method of fabricating the same.

2. Description of the Related Art

A conventional active matrix organic light emitting device includes an anode electrode which is connected to a thin film transistor, a cathode electrode, and a red (R), green (G), or blue (B) organic thin film layer formed therebetween. The organic thin film layer can include multiple layers. Examples of such layers include a hole injecting layer, a hole transporting layer, R, G, B organic emission layers, a hole blocking layer, an electron transporting layer, and an electron injecting layer.

The cathode electrode typically uses a metal electrode, which may be formed of metals such as aluminum (Al), or metals alloys such as Magnesium (Ma)-Silver (Ag). These and other metals and metal alloys facilitate electron transportation and at the same time, protect the underlying organic thin film layer. To render the display more stable and less susceptible to electromagnetic interference, a two-layer cathode electrode is typically used. However it is nearly impossible to obtain optimized efficiency and color coordinates because the conventional cathode electrode is typically formed in a uniform thickness for each of the R, G, or B pixels.

FIG. 1 shows a cross-sectional view of a conventional active matrix organic light emitting device which includes a conventional two-layer structured cathode electrode.

Thin film transistors for R, G, B unit pixels 101, 103, and 105, respectively, are formed on a buffer layer 110 of an insulating substrate 100. The thin film transistors include semiconductor layers 120, 130 and 140 respectively having source/drain regions 121 and 125, 131 and 135, and 141 and 145, gates 161, 163, and 165 formed on a gate insulating layer 150, and source/drain electrodes 181 and 185, 191 and 195, and 201 and 205 formed on an insulating interlayer layer 170.

Anode electrodes, 220, 230 and 240, which are lower electrodes for the R, G, B unit pixels 101, 103, and 105, are formed on a passivation layer 210 and are connected to one of the drain electrodes 185, 195, and 205, respectively, through via holes 107, 109, 111.

Further, a pixel defining layer 250 for isolating respective R, G, B unit pixels 101, 103, 105 is formed on the passivation layer 210. R, G, B organic thin film layers 271, 273,275, respectively, are formed on the anode electrodes 220, 230, 240 for the R, G, B unit pixels 101, 103, 105, respectively, exposed through openings 261, 263, 265 of the pixel defining layer 250. A cathode electrode 280 is formed as an upper electrode on an entire surface of the substrate 100.

The anode electrodes 220, 230, 240 include first anode electrodes 221, 231, 241, respectively, each having high reflectivity, and second anode electrodes 225, 235, 245 for adjusting a work function. The anode electrodes 220, 230, 240 have equal thicknesses for each of the R, G, B unit pixels 101, 103, 105, respectively.

The cathode electrode 280 is formed of a first cathode electrode 281 constructed of a metal or metal alloy and a second cathode electrode 285 constructed of a transparent conductive layer having excellent stability, and is formed on the entire surface of the substrate 100 with a uniform thickness. Exemplary metals and metal alloys commonly used include Lithium Fluoride (LiF) or Magnesium and Silver alloys (Mg:Ag). Exemplary transparent conductive materials include Indium tin oxide (ITO) and Indium zinc oxide (IZO).

SUMMARY OF THE INVENTION

An organic light emitting device is disclosed. In one embodiment, the organic light emitting device includes red (R), green (G) and blue (B) lower electrodes formed on a substrate. R, G, B organic thin film layers are formed on the R, G, B lower electrodes, respectively. Additionally, an upper single or multilayer electrode is formed over the substrate. Portions of the upper electrode that correspond to the R, G, B organic thin film layers, respectively, are formed to each have a different thickness. Various methods for forming the upper electrode using a fine metal mask, a halftone mask, and single and multiple photolithography processes are also disclosed. In particular, a method of fabricating a highly efficient flat panel display capable of obtaining optimized efficiency and color coordinates by forming a cathode electrode having a different thickness for each of R, G, B unit pixels is also disclosed.

BRIEF DESCRIPTION OF THE DRAWINGS

Various features and advantages of the present invention will become more apparent to those of ordinary skill in the art by describing in detail embodiments thereof with reference to the accompanying drawings in which.

Figure 1:
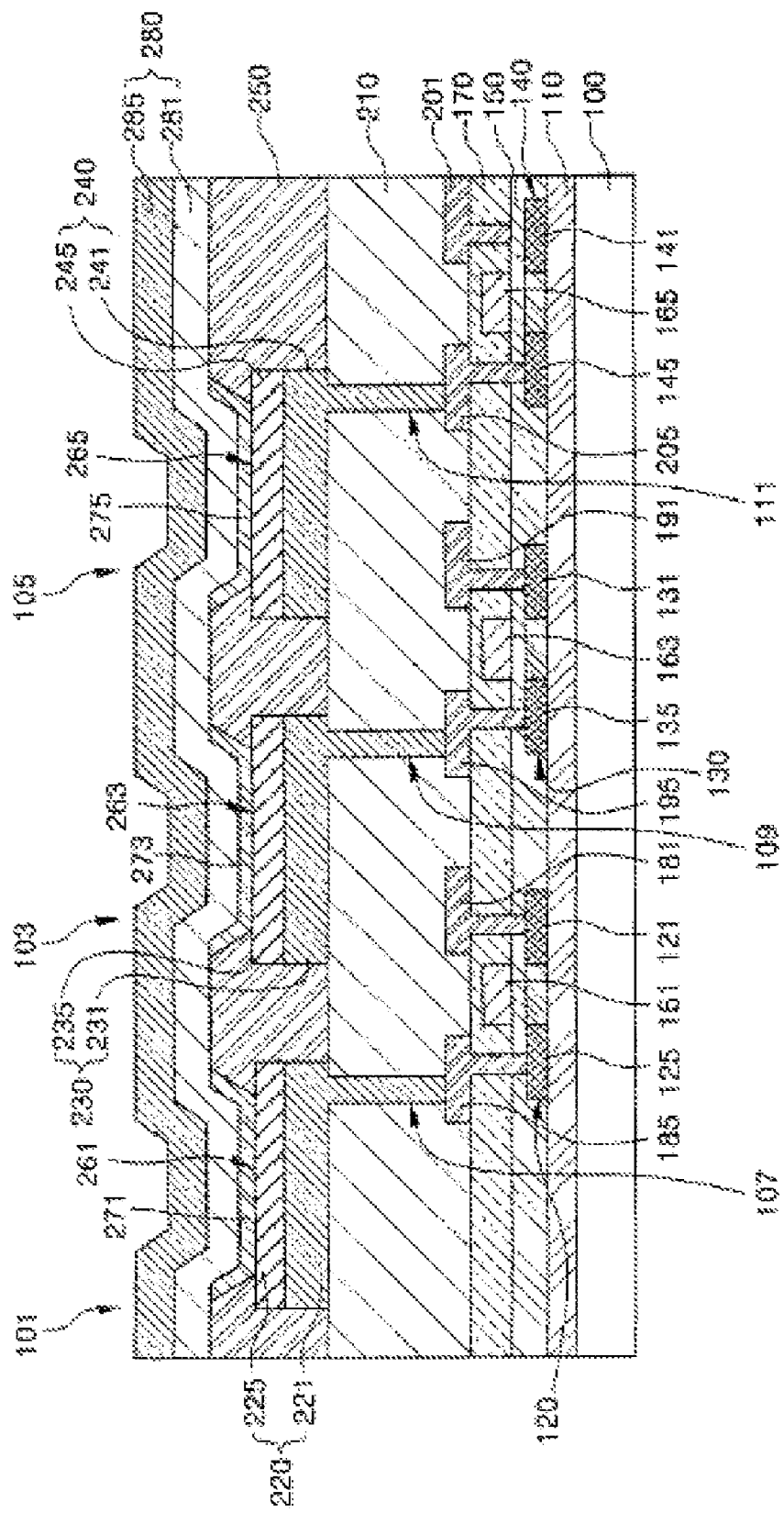
FIG. 1 is a cross-sectional view of a conventional top-emitting organic light emitting device.

The thicknesses of the layers and regions illustrated in the figures are exaggerated for clarity of explanation.

DETAILED DESCRIPTION OF THE INVENTION

Exemplary embodiments of the present invention will now be described more fully with reference to the accompanying drawings. This invention may, however, be embodied in different forms and should not be construed as limited to the embodiments set forth herein. Rather, these embodiments are provided so that this disclosure will be thorough and complete, and will fully convey the scope of the invention to those skilled in the art.

An exemplary embodiment of the present invention provides an organic light emitting device having R, G, B lower electrodes formed on a substrate, R, G, B organic thin film layers (e.g. emission layers) formed on the R, G, B lower electrodes, respectively, and an upper electrode formed over the substrate, wherein a portion of the upper electrode corresponding to one of the R, G, B organic thin film layers has a different thickness from the other portions of the upper electrode.

In a particular exemplary embodiment, the upper electrode includes a first upper electrode material formed on the substrate and a second upper electrode material formed on the is first upper electrode material, such that a portion of the second upper electrode material that corresponds to a R, G or B organic thin film layer has a different thickness from its counterpart portions. The first upper electrode material may be formed of one or more metals and the second upper electrode material may be formed of one or more transparent conductive materials. Exemplary metals and metal alloys include LiF and Mg:Ag and the like. Exemplary transparent conductive materials include ITO, IZO, and the like.

On one exemplary embodiment, the second upper electrode material is formed in a thickness of approximately 800 Å to approximately 2400 Å, because a thickness of approximately 800 Å to approximately 1600 Å provides high luminous efficiency, and a thickness of approximately 800 Å to approximately 2400 Å provides high color purity. A portion corresponding to an R organic thin film layer, of the second upper electrode material, preferably has a thickness of approximately 1200 Å or approximately 2400 Å; a portion corresponding to an G organic thin film layer preferably has a thickness of approximately 800 Å, and a portion corresponding to a B organic thin film layer preferably has a thickness of approximately 1600 Å.

In another exemplary embodiment, the upper electrode includes a first upper electrode material formed on the substrate, and a second upper electrode material on the first upper electrode material, wherein portions corresponding to the R, G, B organic thin film emission layers have different thicknesses. In this embodiment, the second upper electrode material includes first layers for the R, G, B unit pixels independently formed having a different thickness on respective portions of the first upper electrode material corresponding to the R, G, B emission layers, and a second layer formed in a uniform thickness on the first layer and the first upper electrode material.

In another exemplary embodiment, the upper electrode includes a first upper is electrode material formed on the substrate, and a second upper electrode material on the first upper electrode material, wherein portions corresponding to the R, G, B emission layers have different thicknesses. The second upper electrode material includes a first layer of uniform thickness formed on the first upper electrode material, and second layers for the R, G, B unit pixels having different thicknesses on respective portions of the first layer corresponding to the R, G, B emission layers.

In this exemplary configuration, the first upper electrode material is made of one or more metals or metal alloys, such as, but not limited to LiF, Mg:Ag, and the like, and the second upper electrode material is made of one or more transparent conductive materials such as, but not limited to, IZO and ITO, respectively. The cumulative thickness of the first layer and the second layer of the second upper electrode material is approximately 800 Å to approximately 2400 Å.

Moreover, another exemplary embodiment of the present invention provides a method of forming an organic light emitting device. In this method R, G, B unit pixels, including their corresponding R, G, B lower electrodes and their corresponding R, G, and B organic film layers, are formed on a substrate. An upper electrode having portions of varying thickness that correspond to the R, G, and B emission layers is then formed over the substrate. Method steps may include, inter alia, forming the upper electrode, (e.g., forming a first upper electrode material on the substrate) and forming a second upper electrode material on the first upper electrode material to have a different thickness for each of the corresponding R, G, B emission layers. In one embodiment, forming the second upper electrode material may include forming on portions of the first upper electrode material corresponding to the R, G, B emission layers a first layer, a portion or portion of which has a different thickness for each of the corresponding R, G, B emission layers; and forming a second layer of uniform thickness on the first layer and the first upper electrode material.

The first layer of the second upper electrode material is formed independently, using a fine metal mask, by depositing the second upper electrode material in such a manner that portions of the material have a different thickness for each of the corresponding R, G, B emission layers. Alternatively, the first layer may be formed and independently patterned to have a different thickness for each of the corresponding R, G, B emission layers using a three-time repetition of a photolithography process. Alternatively, the first layer may be formed using a single photolithography process that uses a half-tone mask to pattern portions of the first layer material to have a different thickness for each of the corresponding R, G, and B emission layers.

In another exemplary embodiment, forming the second electrode material on the first electrode material may include forming a first layer in a uniform thickness on the first upper electrode material and forming a second layer on the first layer such that portions to the second layer corresponding to their respective R, G, B emission layers each have a different thickness.

As with the first layer, the second layer of the second upper electrode material may be formed to have portions of varying thickness using a fine metal mask, thrice-repeated photolithography process, single photolithography process using a half-tone mask, or like material forming process.

Figure 2:
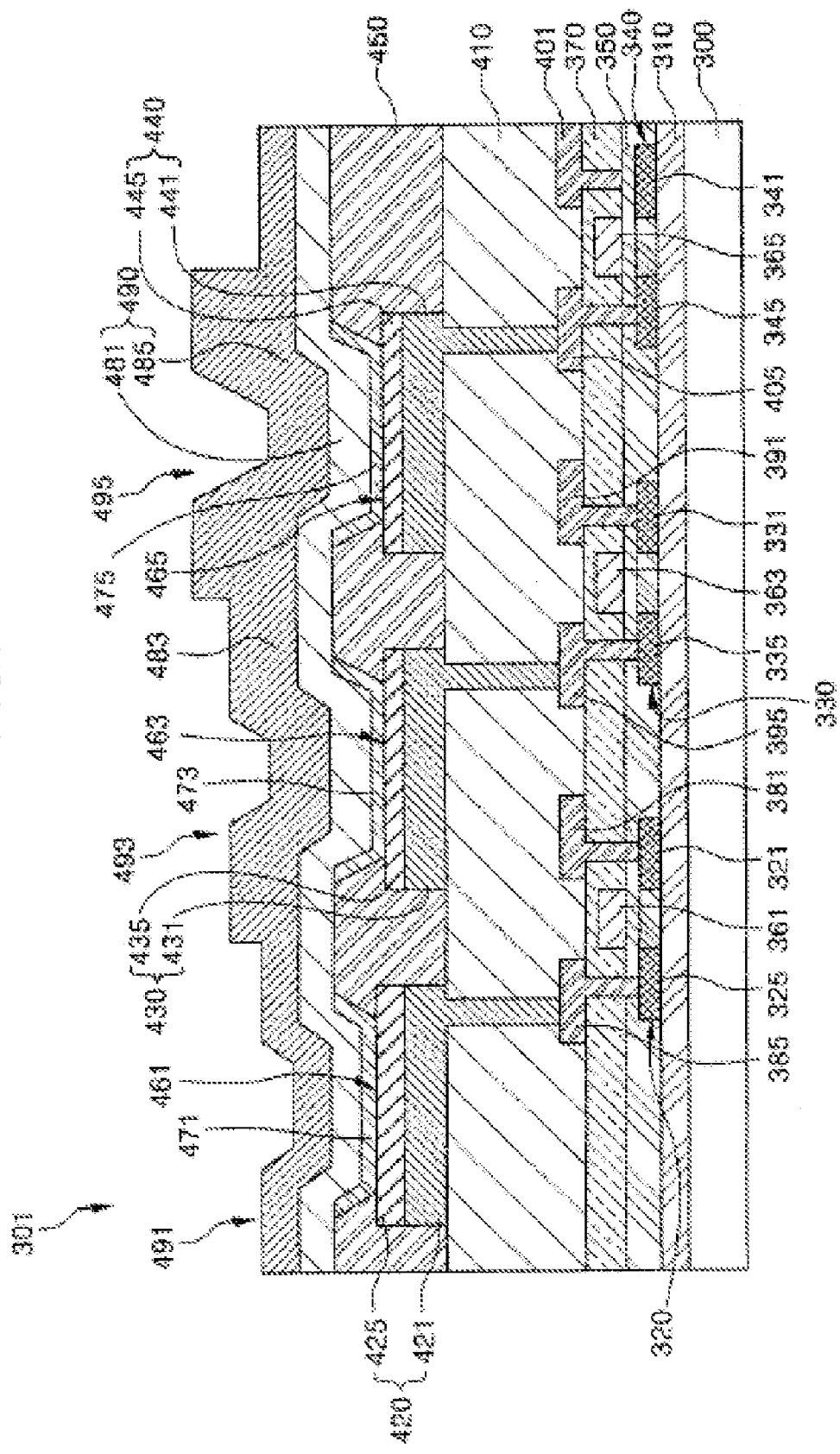
FIG. 2 is a cross-sectional view of an top-emitting organic light emitting device configured in accordance with an embodiment of the present invention.

FIG. 2 shows a cross-sectional view of an active matrix organic light emitting device 301, including a two-layer structured cathode electrode, configured in accordance with an embodiment of the present invention.

Referring to FIG. 2, thin film transistors configured in R, G, B unit pixels 491, 493, 495 are formed on a buffer layer 310 of a substrate 300 and include thin film transistors. The respective R, G, and B unit pixel thin film transistors include semiconductor layers 320, 330 and 340 formed on the buffer layer 310 and respectively having source/drain regions 321 and 325, 331 and 335, and 341 and 345, gate electrodes 361, 363 and 365 formed on a gate insulating layer 350 on the respective semiconductor layers 320, 330 and 340, and source/drain electrodes 381 and 385, 391 and 395, and 401 and 405 formed on an insulating layer 370, and connected to the source/drain regions 321 and 325, 331 and 335, and 341 and 345, respectively.

Anode electrodes 420, 430 and 440, which are lower electrodes for the R, G, B unit pixels 491, 493, 495, respectively, are each connected to one of the source/drain electrodes 381 and 385, 391 and 395, and 401 and 405 of the respective R, G, and B thin film transistors. The anode electrodes 420, 430 and 440 are formed on a passivation layer 410. Although this exemplary embodiment of the invention illustrates the respective anode electrodes 420, 430, 440 as having a laminate structure of metal materials 421, 431, 441 and transparent conductive materials 425, 435, 445, the anode electrodes 420, 430 and 440 are necessarily not limited to such a configuration, but may be formed into a single layer or multi-layer structure.

A pixel defining layer 450 is formed on the passivation layer 410 for isolating the R, G, B unit pixels 491, 493, 495. R, G, B organic thin film layers 471, 473, 475, respectively, are formed in openings 461, 463, 465 of the pixel defining layer 450, and on anode electrodes 420, 430, 440, respectively. A cathode electrode 490 is formed over the entire surface of the substrate 300, and has a different thickness for each of the R, G, B unit pixels 491, 493, 495. Each of the organic thin film layers 471, 473, 475 includes at least one organic thin film layer. Depending on the embodiment, the organic thin film layer may be an electron hole injecting layer, an electron hole transporting layer, R, G, B organic emission layers, an electron hole blocking layer, an electron transporting layer, an electron injecting layer, or like layers.

The cathode electrode 490 includes a first cathode electrode material 481 formed over the entire surface of the substrate 300 and having a uniform thickness for each of the R, G, B unit pixels 491, 493, 495, and a second cathode electrode material 485 formed on the first cathode electrode material 481 and having a different thickness for each of the R, G, B unit pixels 491, 493, 495. In an exemplary embodiment, the first cathode electrode material 481 is made of a metal or metal alloy such as LiF or Mg:Ag or the like; and the second cathode electrode material 485 is composed of a transparent conductive material such as IZO or ITO, or the like.

If IZO is used to form the second cathode electrode material 485 of the cathode electrode 490, the luminous efficiency and color coordinates of blue (B) color vary depending on the thickness of the IZO layer. These variations are described below and shown in Table 1 and FIGS. 7 and 8, respectively.

TABLE 1

| IZO layer thickness | Blue luminous efficiency | Blue color coordinates |
|---|---|---|
| 800 Å | 3.4 cd/A | 0.13, 0.13 |
| 1200 Å | 4.1 cd/A | 0.15, 0.22 |
| 1600 Å | 4.1 cd/A | 0.12, 0.15 |
| 2400 Å | 3.8 cd/A | 0.13, 0.13 |
| NTSC system criterion | | 0.14, 0.08 |

As used above, the NTSC (national television systems committee) system means a color TV standard system. However, other TV or media systems may be supported.

Figure 7:
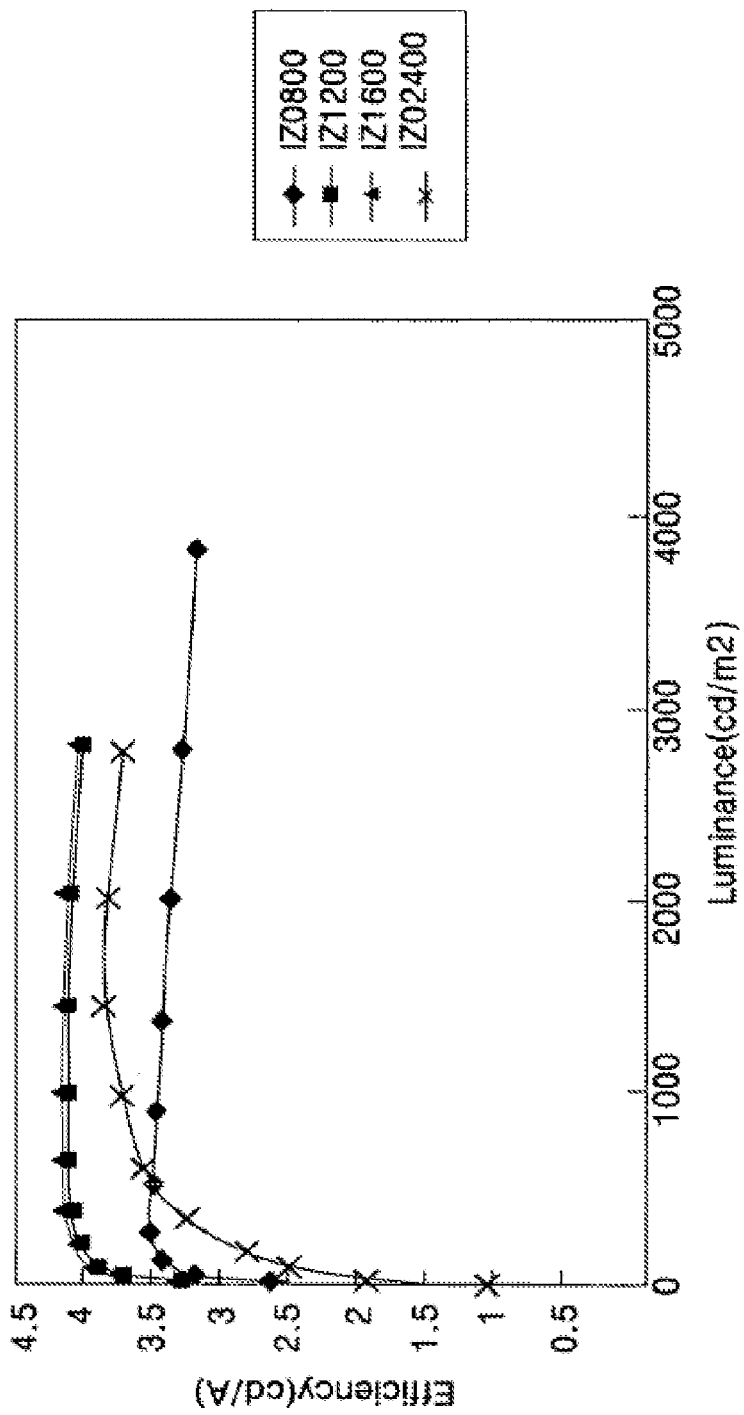
FIG. 7 illustrates blue (B) luminous efficiency depending on a thickness of a cathode electrode in an organic light emitting device configured in accordance with an embodiment of the present invention.
Figure 8:
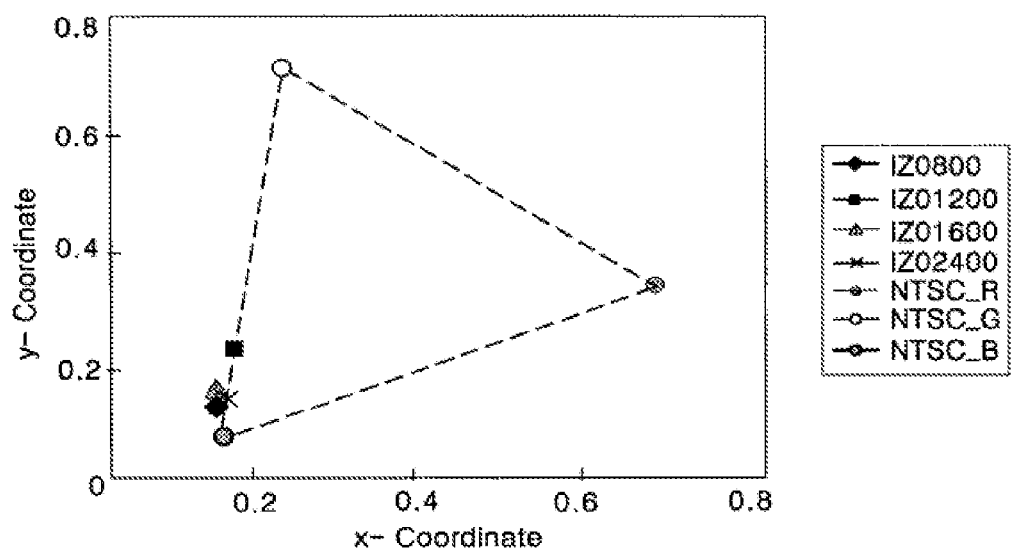
FIG. 8 illustrates blue (B) color coordinates depending on a thickness of a cathode electrode in an organic light emitting device, configured in accordance with an embodiment of the present invention.

Referring to Table 1 and FIGS. 7 and 8, if the IZO layer used as the second cathode electrode material 485 of the cathode electrode 490 is deposited in a thickness of approximately 800 Å to approximately 2400 Å, a high luminous efficiency of B color can be obtained. In particular, if the IZO is deposited to a thickness of approximately 1200 Å to approximately 1600 Å, a high luminous efficiency of 4 cd/A can be obtained. Furthermore, if the IZO layer is deposited in a thickness of approximately 800 Å to approximately 2400 Å, a high color purity of B color can be obtained. Such color purity, compared to that of the NTSC system, in the IZO layer thickness of approximately 1600 Å is superior to that in the IZO layer thickness of approximately 1200 Å. Thus, in one embodiment, the second cathode electrode material 485, corresponding to a blue emission layer, of the cathode electrode 490 has a thickness of approximately 1600 Å in order to meet both high luminous efficiency and color purity for B color.

If IZO is used to form the second cathode electrode material 485 of the cathode electrode 490, the luminous efficiency and color coordinates of green (G) color vary depending on the thickness of the IZO layer. These variations are described and shown in Table 2 and FIGS. 9 and 10, respectively.

TABLE 2

| IZO layer thickness | Green luminous efficiency | Green color coordinates |
|---|---|---|
| 800 Å | 33.6 cd/A | 0.26, 0.67 |
| 1200 Å | 9.9 cd/A | 0.34, 0.61 |
| 1600 Å | 5.6 cd/A | 0.28, 0.64 |
| 2400 Å | 15.8 cd/A | 0.28, 0.67 |
| NTSC criterion | | 0.21, 0.71 |

Figure 9:
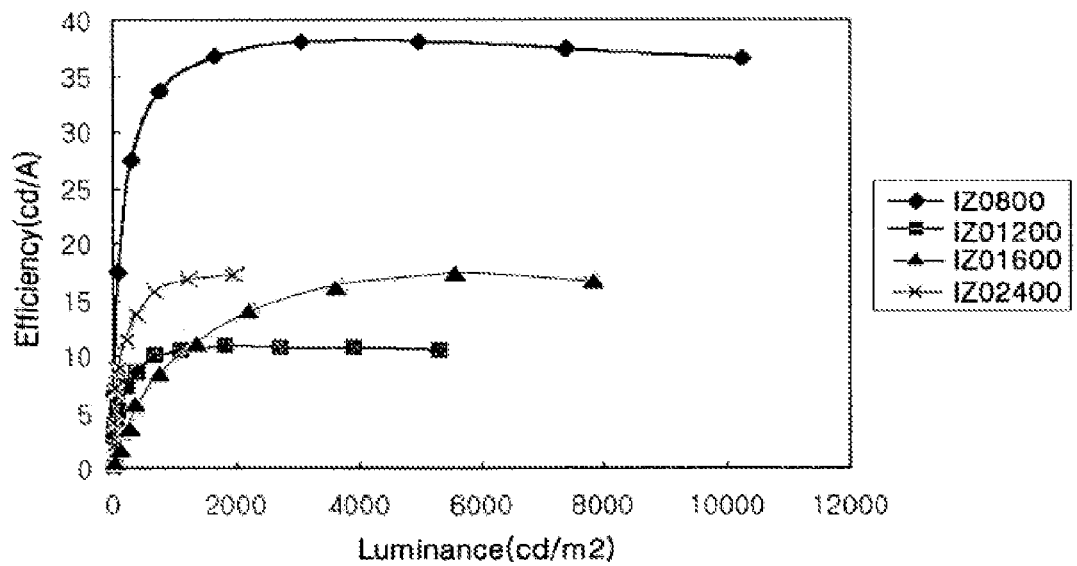
FIG. 9 illustrates green (G) luminous efficiency depending on a thickness of a cathode electrode in an organic light emitting device, configured in accordance with an embodiment of the present invention.
Figure 10:
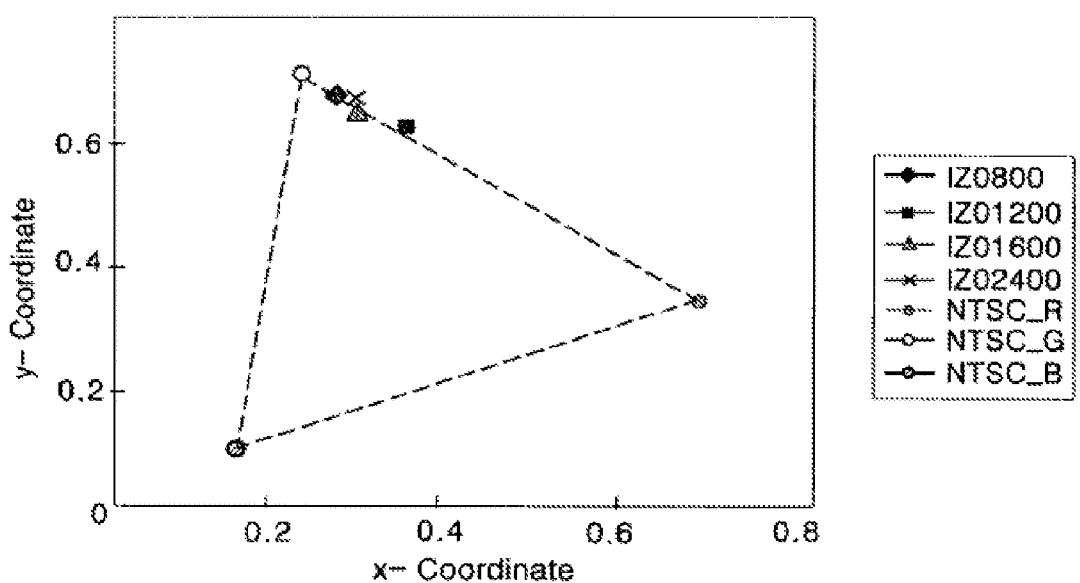
FIG. 10 illustrates green (G) color coordinates depending on a thickness of a cathode electrode in an organic light emitting device, configured in accordance with an embodiment of the present invention.

Referring to Table 2 and FIGS. 9 and 10, if the IZO layer used as the second cathode electrode material 485 of the cathode electrode 490 is deposited in the thickness of approximately 800 Å to approximately 2400 Å, a high luminous efficiency and color purity of G color can be obtained. Superior efficiency is obtained when the IZO layer, which is the second cathode electrode material 485, has a thickness of approximately 800 Å. Additionally, the color purity, compared to that of the NTSC, in the IZO layer thickness of approximately 800 Å or approximately 2400 Å is superior to an IZO layer deposited to thickness of approximately 1200 Å or approximately 1600 Å. Thus, in one embodiment, the second cathode electrode material 485, corresponding to a green (G) emission layer, of the cathode electrode 490 has a layer thickness of approximately 800 Å in order to meet both high luminous efficiency and color purity for green color.

If IZO is used to form the second cathode electrode material 485 of the cathode electrode 490, the luminous efficiency and color coordinates of red (R) color vary depending on the IZO layer thickness. These variations are described below and shown in Table 3 and FIGS. 11 and 12, respectively.

TABLE 3

| IZO layer thickness | Red luminous efficiency | Red color coordinates |
| --- | --- | --- |
| 800 Å | 8.3 cd/A @ 400nit | 0.64, 0.35 |
| 1200 Å | 8.1 cd/A @ 400nit | 0.66, 0.34 |
| 1600 Å | 6.4 cd/A | 0.66, 0.34 |
| 2400 Å | 5.8 cd/A | 0.64, 0.34 |
| NTSC criterion | | 0.67, 0.33 |

Figure 11:
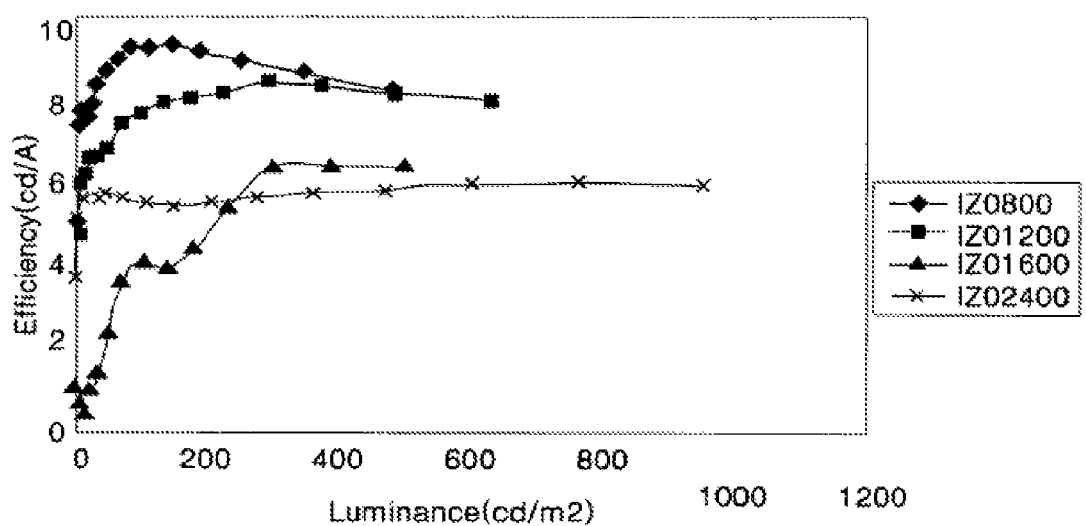
FIG. 11 illustrates red (R) luminous efficiency depending on a thickness of a cathode electrode in an organic light emitting device, configured in accordance with an embodiment of the present invention.
Figure 12:
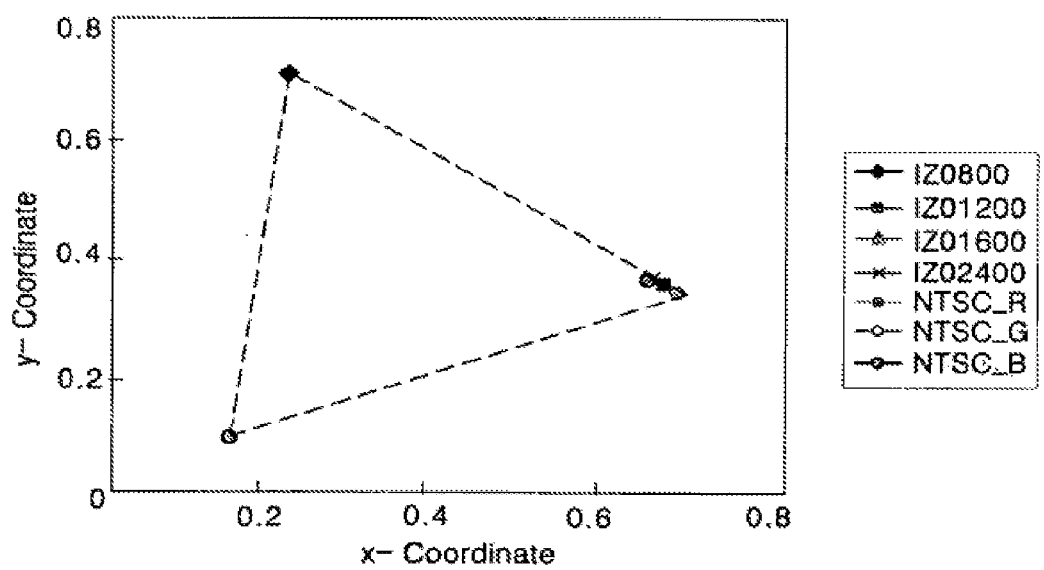
FIG. 12 illustrates red (R) color coordinates depending on a thickness of a cathode electrode in an organic light emitting device, configured in accordance with an is embodiment of the present invention.

Referring to Table 3 and FIGS. 11 and 12, if the IZO layer used as the second cathode electrode material 485 of the cathode electrode 490 is deposited in the thickness of approximately 800 Å to approximately 2400 Å, a high luminous efficiency and color purity with respect to the red color can be obtained. In one embodiment, the IZO layer being the second cathode electrode material 485 has a thickness of approximately 1200 Å or approximately 2400 Å, from an efficiency aspect, for required luminance. Superior color purity, as compared to the NTSC, is excellent for the IZO layer thickness of approximately 800 Å, 1200 Å, 1600 Å and 2400 Å. Thus, in one embodiment, the second cathode electrode material 485, corresponding to the red (R) emission layer, of the cathode electrode 490 has a layer thickness of approximately 1200 Å or approximately 2400 Å in order to meet high luminous efficiency and color purity with respect to the red color.

In an exemplary embodiment, as described above, it is preferable that the second cathode electrode material 485 of the cathode electrode 490 be deposited in a thickness of approximately 800 Å to approximately 2400 Å. In such an embodiment, it is also preferable that the second cathode electrode material 485 be deposited in the thickness of approximately 800 Å to approximately 1600 Å to obtain high luminous efficiency, and that the second cathode electrode material 485 be deposited in the thickness of approximately 800 Å to approximately 2400 Å to obtain high color purity.

Figure 13:
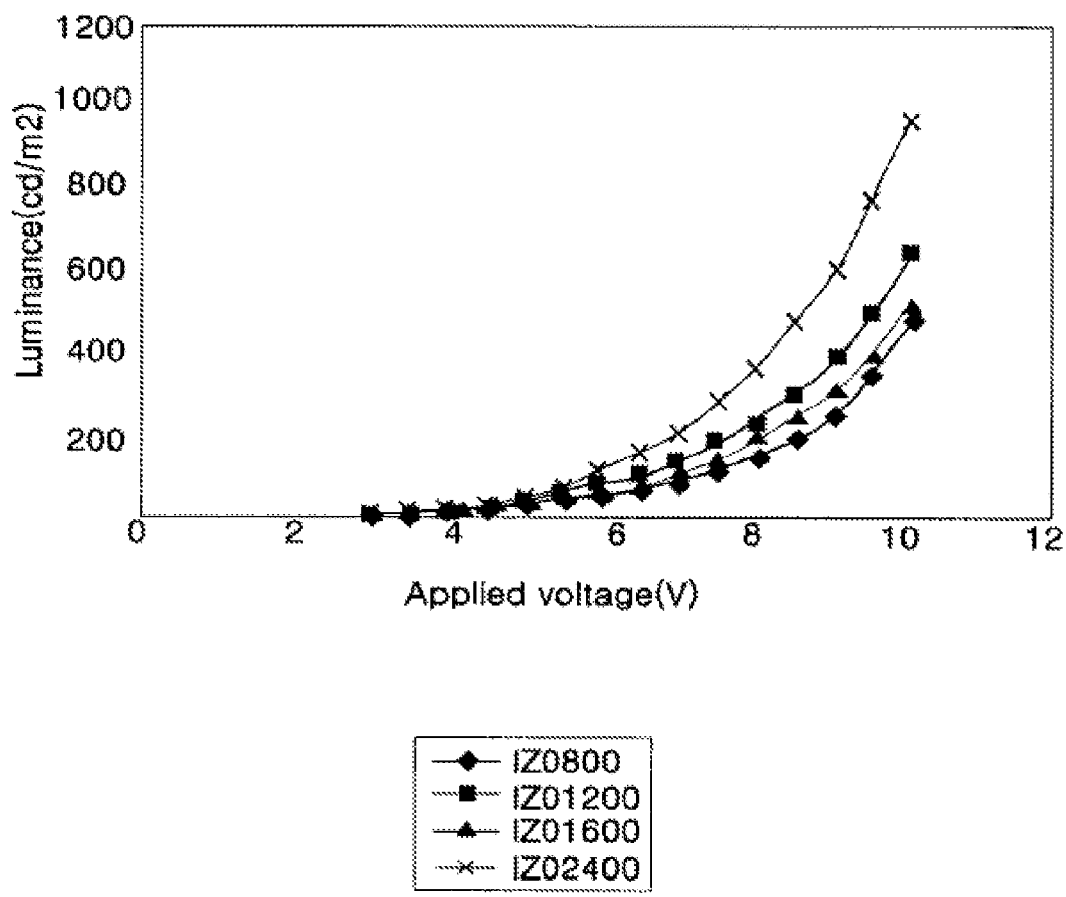
FIG. 13 illustrates red (R) luminance depending on an applied voltage in an organic light emitting device, configured in accordance with an embodiment of the present invention.

FIG. 13 illustrates red (R) luminance depending on an amount of voltage applied in an organic light emitting device configured in accordance with an embodiment of the present invention. The red (R) luminance increases as the applied voltage increases. If IZO is used as the second transparent conductive layer of the second cathode electrode material, a high R luminance is obtained when the IZO layer thickness is approximately 1200 Å or approximately 2400 Å.

Turning now to the methods of the present invention.

FIGS. 3A to 3D are cross-sectional views illustrating a method of forming a cathode electrode having a different thickness in an organic light emitting device in accordance with a first method of the present invention. FIGS. 3A to 3D only show a cathode electrode formed on a substrate 500.

In this first embodiment the cathode electrode is formed by depositing a second cathode electrode material using a fine metal mask in such a manner that portions of the second cathode electrode material have a different thickness for each of corresponding R, G, B unit pixels.

Figure 3A:
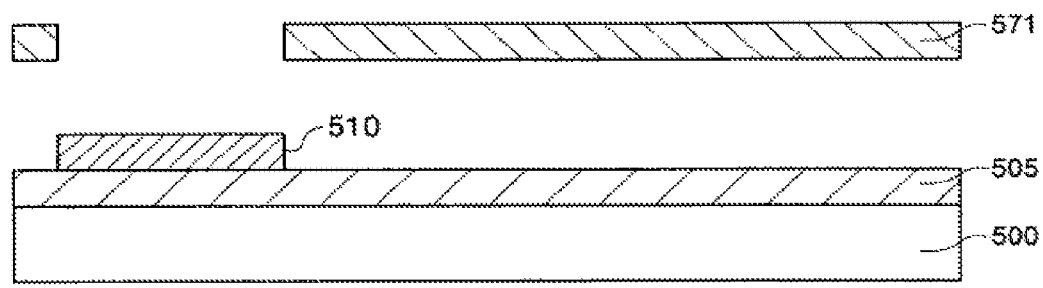
FIGS. 3A to 3D are sequential cross-sectional views illustrating a method of forming in an organic light emitting device, a cathode electrode having a different thickness for each of R, G, B unit pixels, in accordance with a first embodiment of the present invention.
Figure 3B:
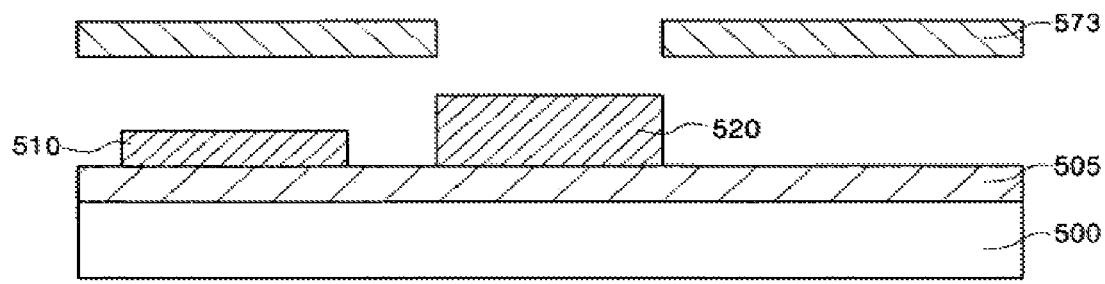

As shown in FIG. 3A, a first cathode electrode material 505, such as LiF or Mg:Ag, is formed on a substrate 500. Then, using a fine metal mask 571, a first transparent conductive layer 510 for an R unit pixel is formed on a portion of the first cathode electrode material 505 that corresponds to an R organic emission layer (not shown). As shown in FIG. 3B, a fine metal mask 573 is used to form a first transparent conductive layer 520 for a G unit pixel on a portion of the first cathode electrode material 505 that corresponds to a G organic emission layer (not shown).

Figure 3C:
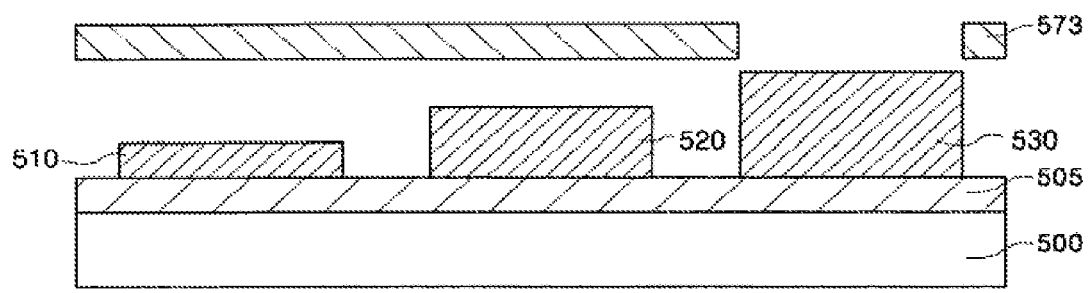
Figure 3D:
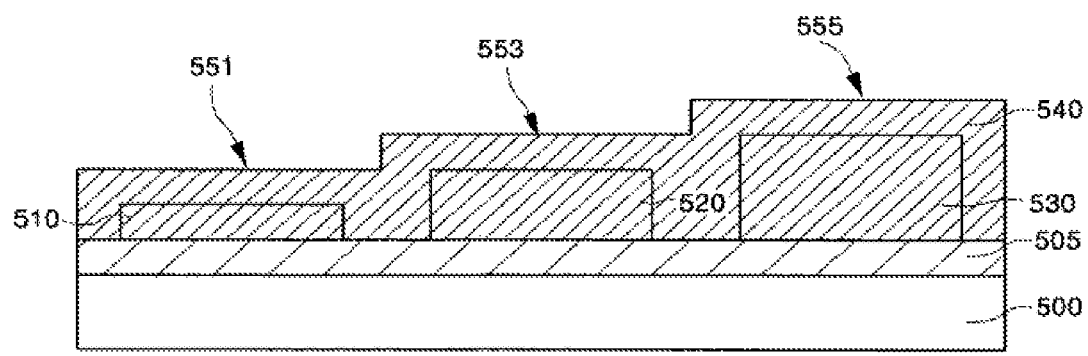

Subsequently, as shown in FIG. 3C, a first transparent conductive layer 530 for a B unit pixel is formed on a portion of the first cathode electrode material 505 that corresponds to a B organic emission layer (not shown), using a fine metal mask 573. Finally, as shown in FIG. 3D, a second transparent conductive layer 540 is formed in a uniform thickness on the first transparent conductive layers 510, 520, 530 for the R, G, and B unit pixels 551, 553, 555, and the first cathode electrode material 505.

Thus in one embodiment, the second cathode electrode material includes the first transparent conductive layers 510, 520, 530 formed independently to have a different thickness for each of the R, G, B unit pixels 551, 553, 555; while the second transparent conductive layer 540 is formed to have a uniform thickness. The cathode electrode, therefore, is composed of the first cathode electrode material 505 having a uniform thickness on the substrate 500 and of the second cathode electrode material having portion of a different thickness for each of corresponding R, G, B unit pixels 551, 553 and 555.

In the exemplary embodiment described above, the thickness of the second cathode electrode material, (namely, a sum of the thickness of the first transparent conductive is layers 510, 520, 530 and the thickness of the second transparent conductive material 540) is approximately 800 Å to approximately 2400 Å. In this embodiment, the thickness of the portion of the second cathode electrode material corresponding to the R unit pixel that corresponds to the R organic emission layer, (namely, the sum of the thickness of the first transparent conductive layer 510 and the thickness of the second transparent conductive layer 540) is approximately 1200 Å or approximately 2400 Å in order to obtain high luminous efficiency and color purity for the red (R) color. The thickness of the portion of the second cathode electrode material corresponding to the G unit pixel that corresponds to the G organic emission layer, (namely, the sum of the thickness of the first transparent conductive layer 520 and the thickness of the second transparent conductive layer 540) is approximately 800 Å in order to obtain high luminous efficiency and color purity for the green (G) color. The thickness of the second cathode electrode material for the B unit pixel that corresponds to the B organic emission layer, (namely, the sum of the thickness of the first transparent conductive layer 530 and the thickness of the second transparent conductive layer 540) is approximately 1600 Å in order to obtain high luminous efficiency and color purity for the blue (B) color.

FIGS. 4A to 4D are cross-sectional views illustrating a second method of forming a cathode electrode having portions of different thickness in an organic light emitting device, in accordance with a second method of the present invention. These Figures only show a cathode electrode formed on a substrate 600.

Figure 4A:
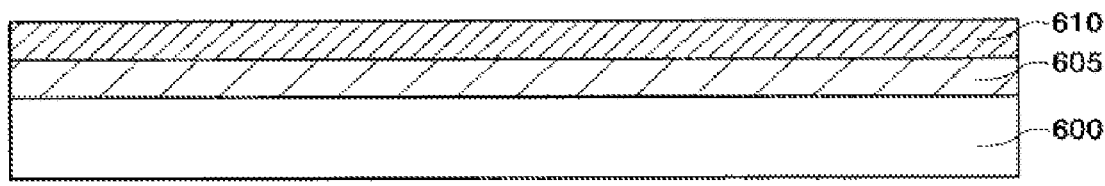
FIGS. 4A to 4D are sequential cross-sectional views illustrating a method of forming, in an organic light emitting device, a cathode electrode having a different thickness for each of R, G, B unit pixels, in accordance with a second method of the present invention.
Figure 4B:
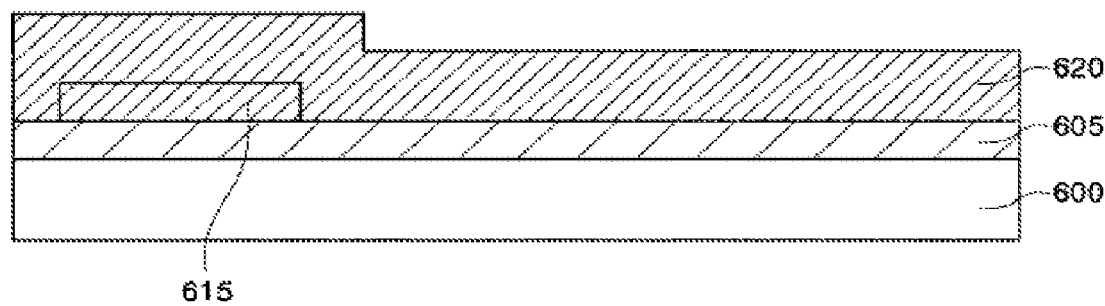

In accordance with a second embodiment, this second method of forming a cathode electrode is different from the first embodiment only in that the cathode electrode is independently patterned to include different thickness for each of the corresponding R, G, B unit pixels using a three-time repetition of a photolithography process. That is, as shown in FIG. 4A, is a transparent conductive layer 610 is deposited in a thickness suitable for an R unit pixel on a substrate 600 on which a first cathode electrode 605 is formed. Then, as shown in FIG. 4B, a portion of the first transparent conductive layer 615 for the R unit pixel that corresponds to an R organic emission layer (not shown) is formed by photolithographing the transparent conductive layer 610 using a first mask (not shown).

Figure 4C:
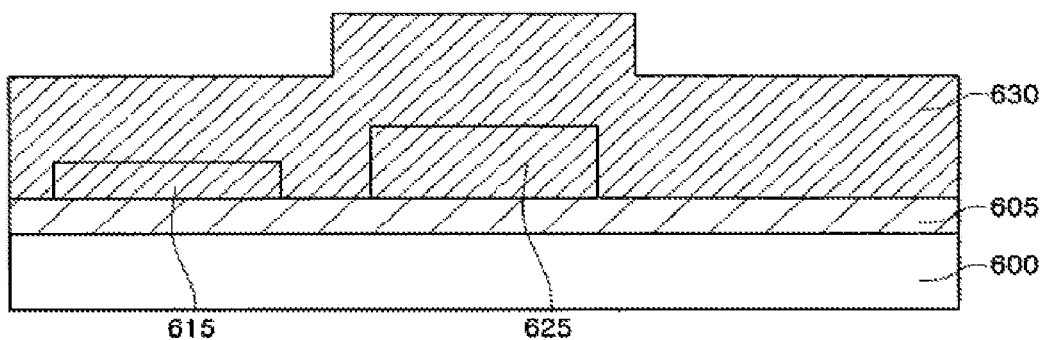

Subsequently, a transparent conductive layer 620 is deposited to a thickness suitable for a G unit pixel on an entire surface of the substrate 600, and then a portion of the first transparent conductive layer 625 corresponding to the G unit pixel is formed by photolithographing the transparent conductive layer 620 using a second mask (not shown), as shown in FIG. 4C.

Figure 4D:
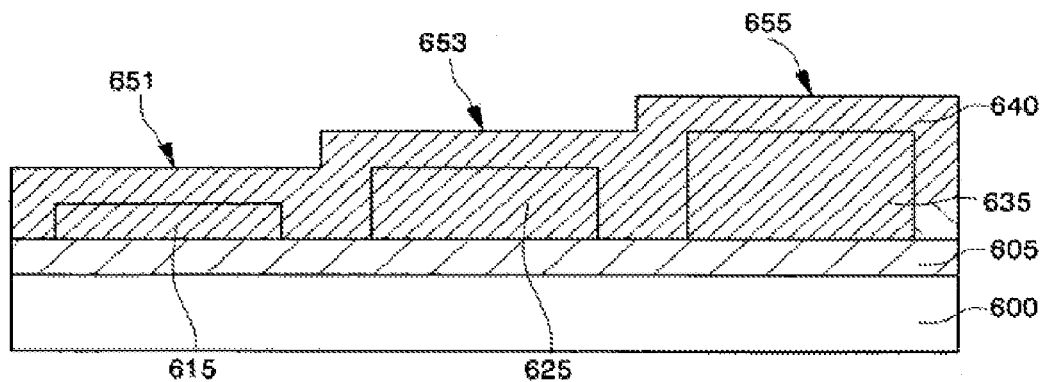

Next, a transparent conductive layer 630 is deposited over the entire surface of the substrate 600 to a thickness suitable for a B unit pixel, and then a portion of the first transparent conductive layer 635 for the B unit pixel is formed by photolithographing the transparent conductive layer 630 using a third mask (not shown). Subsequently, a second transparent conductive layer 640 is formed in a uniform thickness on the first transparent conductive layers 615, 625 and 635 and the first cathode electrode material 605, as shown in FIG. 4D.

Thus, in this exemplary embodiment, the second cathode electrode material includes the first transparent conductive layers 615, 625, 635 for the R, G, B unit pixels 651, 653 and 655, which were independently formed to have different thickness so as to correspond to the R, G, B organic emission layers. Additionally, the second transparent conductive layer 640 is formed over the entire surface of the substrate 600. Consequently, the cathode electrode is composed of the first cathode electrode material 605 having a uniform thickness and of the second cathode electrode material, portions of which have a different thickness for each of the corresponding R, G, B unit pixels 651, 653 and 655.

FIGS. 5A to 5D are cross-sectional views illustrating another exemplary method of forming a cathode electrode in an organic light emitting device to have portions of different thickness, in accordance with a third method of the present invention. These figures only show a cathode electrode formed on a substrate.

Figure 5A:
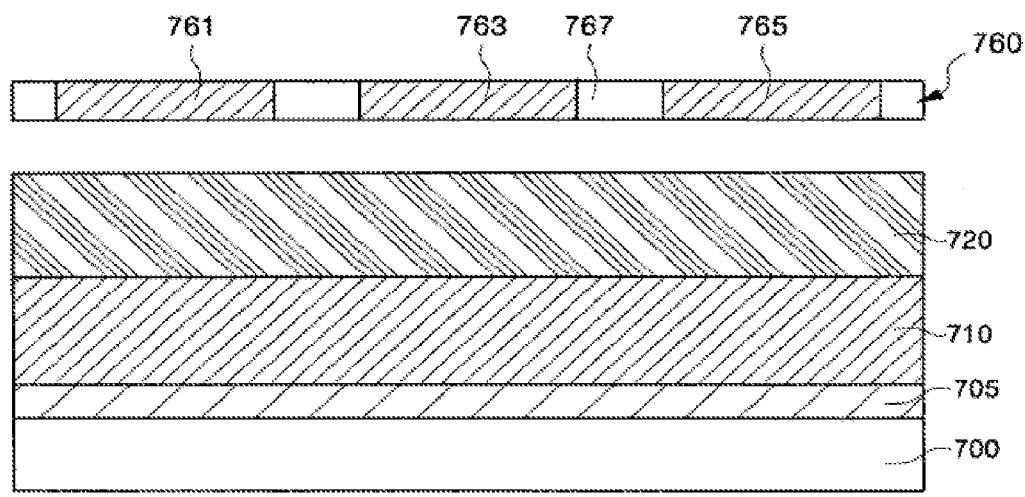
FIGS. 5A to 5D are sequential cross-sectional views illustrating a method of forming, in an organic light emitting device, a cathode electrode having a different thickness for each of R, G, B unit pixels, in accordance with a third method of the present invention.

The method of forming a cathode electrode in accordance with the third embodiment is different from the first or second embodiment only in that portions of a cathode electrode are independently patterned to have a different thickness for each of corresponding R, G, B unit pixels using a single photolithography process which uses a halftone mask. As shown in FIG. 5A, a first cathode electrode material 705, such as LiF or Mg:Ag, is formed with a uniform thickness on a substrate 700, and a transparent conductive layer 710 is deposited on the first cathode electrode 705. The transparent conductive layer 710 is covered with a photosensitive layer 720. In one embodiment, the transparent conductive layer 710 is deposited to at least the same thickness as that of a portion of a second cathode electrode material corresponding a unit pixel which has the largest thickness of R, G, B unit pixels formed at a subsequent process.

Referring again to FIG. 5A, a halftone mask 760 is aligned to the substrate on which the photosensitive layer 720 and the transparent conductive layer 710 have been deposited, and then an exposure process is performed. The halftone mask 760 may include a transmitting pattern 767, semi-transmitting patterns 761 and 763, and a blocking pattern 765. It will be appreciated that the transmitting pattern 767 corresponds to a portion in which all the photosensitive layer will be removed to transmit all the incident light in the exposure process. The blocking pattern 765 corresponds to a portion in which the first cathode electrode of the B unit pixel will be formed, namely, a portion in which the photosensitive layer will be left as it is, to block all incident light in the exposure process. Semi-transmitting patterns 761 and 763 correspond to portions in which the first cathode electrode of the R and G unit pixels will be formed, namely those portions in which the photosensitive layer will be removed by a constant thickness to transmit only a portion of the incident light in the exposure process. The semi-transmitting pattern 761, corresponding to the R unit pixel, of the semi-transmitting patterns 761, 763 is formed to transmit relatively more incident light in the exposure process than the semi-transmitting pattern 763 corresponding to the G unit pixel.

Figure 5B:
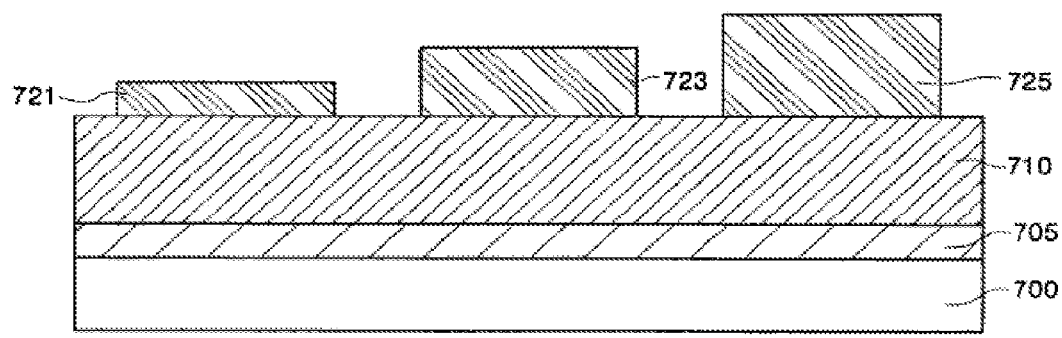

Since the amount of the light exposed through the semi-transmitting patterns 761, 763 and the blocking pattern 765 is different from each other when the exposure and development process are performed, photosensitive layer patterns 721, 723, 725 corresponding to the R, G, B unit pixels are formed to have different thicknesses from each other, as shown in FIG. 5B.

Figure 5C:
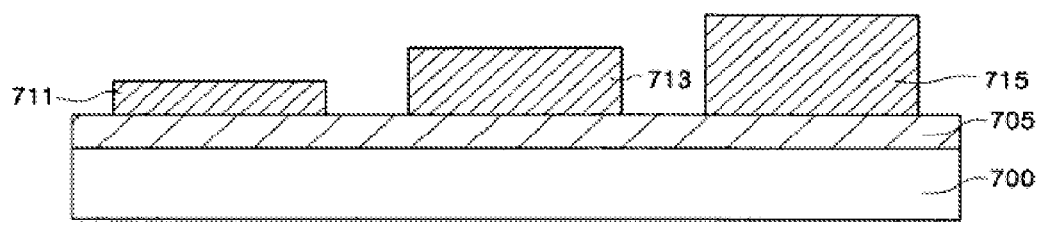

As shown in FIG. 5C, if the first cathode electrode material 710 is patterned using the photosensitive layer patterns 721, 723 and 725 as masks, the first transparent conductive layers 711, 713 and 715 for the R, G, B unit pixels will be formed to have a different thicknesses for each of the R, G, B unit pixels because the photosensitive layer patterns 721, 723 and 725 have a different thickness for each of the R, G, B unit pixels.

Figure 5D:
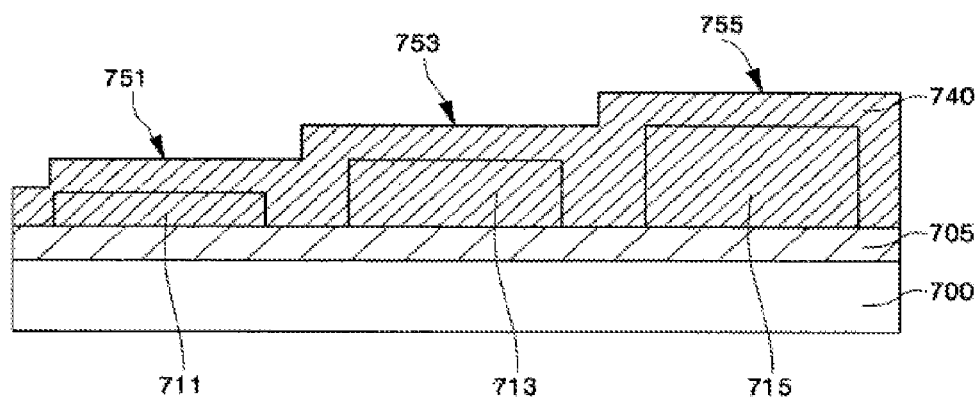

As shown in FIG. 5D, a second transparent conductive layer 740 may then be formed in a uniform thickness on the first transparent conductive layers 711, 713, 715 (that respectively correspond to the R, G, B unit pixels) and on the first cathode electrode material 705. Thus in this embodiment, the second cathode electrode material includes the first transparent conductive layers 711, 713, 715, each independently, formed to have a different thickness that corresponds to R, G, B unit pixels 751, 753, 755, which have corresponding R, G, B organic thin film layers. Moreover, the second transparent conductive layer 740 in this embodiment has a uniform thickness. Consequently, the cathode electrode is composed of the first cathode electrode material 705 having a uniform thickness, and the second cathode electrode material having portions of a different thickness for each of the corresponding R, G, B unit pixels 751, 753, 755.

Figure 6:
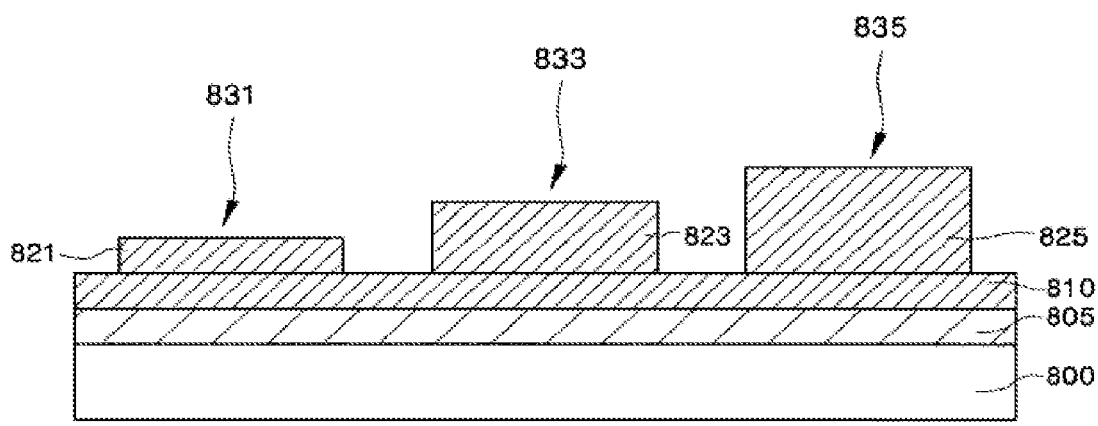
FIG. 6 is a cross-sectional view illustrating a method of forming, in an organic light emitting device, a cathode electrode having a different thickness for each of R, G, B unit pixels, in accordance with a fourth embodiment of the present invention.

FIG. 6 is a cross-sectional view of an organic light emitting device in accordance with a fourth method of the present invention.

The organic light emitting device of the fourth embodiment is different from other embodiments in that in forming the second cathode electrode material, a first transparent conductive layer having a uniform thickness is formed on a first cathode electrode material, and then a second transparent conductive layer having portions of different thickness for each of corresponding R, G, B unit pixels is formed.

In this fourth exemplary embodiment, the cathode electrode includes a first cathode electrode material 805 composed of a metal material such as LiF or Mg:Ag formed in a uniform thickness on a substrate 800, and a second cathode electrode material having portions of different thickness for each of the corresponding R, G, B unit pixels that are formed on the first cathode electrode material 805. The second cathode electrode material further includes a first transparent conductive layer 810 formed in a uniform thickness on the first cathode electrode material 805, and a second transparent conductive layers 821, 823, 825 independently formed on the first transparent conductive layer 810 to have a different thickness for each of the corresponding R, G, B unit pixels 831, 833, 835.

An exemplary method of forming a cathode electrode having portions of different thickness for each of the corresponding R, G, B unit pixels is now described.

To begin, the first cathode electrode material 805 is formed by depositing a metal or metal alloy material such as LiF or Mg:Ag or the like in a uniform thickness on the substrate 800. Then the first transparent conductive layer 810 is formed by depositing a transparent conductive material such as ITO or IZO in a uniform thickness on the first cathode electrode material 805.

Subsequently, the second transparent conductive layers 821, 823, 825 each having a different thickness for each of the corresponding R, G, B unit pixels 831, 833 and 835 are formed on the first transparent conductive layer 810. A method of forming the second transparent conductive layers 821, 825, 827 having a different thickness for each of R, G, B unit pixels 831, 833, 835 uses the same methods as were used to form the first transparent conductive layer of the first to third embodiments shown in FIGS. 3A to 3D, 4A to 4D, and 5A to 5D.

Herein the cathode electrode is shown as increasing in thickness in an order of R, G, and B unit pixels. However, it is understood that the invention is not so limited. Rather than portions of the cathode electrode corresponding to the R, G, B unit pixels may be formed in any predetermined thickness suitable for luminous efficiency and color purity, as described above.

Although the embodiments of the present invention have been described by way of the top-emitting structure, they are also applicable to a bottom-emitting and double-side-emitting structure, where they may be used to improve high efficiency and color purity. Further, although the embodiments of the present invention have illustrated the cathode electrode as using a two-layer of a metal material and a transparent conductive layer, the present invention is applicable to all methods of forming a cathode electrode having portions of different thickness for each of the corresponding R, G, B unit pixels in order to obtain optimal color purity and luminous efficiency for each of R, G, B unit pixels.

Although the present invention has been described with reference to the preferred embodiments thereof, those skilled in the art will understand that the present invention can be variously modified and changed without departing from the spirit and the scope of the present invention as defined by the following claims.

What is claimed is:

1. A method of forming an organic light emitting device having R, G, B unit pixels, in which the R, G, B unit pixels comprise R, G, B lower electrodes formed on a substrate, R, G, B organic thin film layers each formed on the R, G, B lower electrodes, and an upper electrode formed over the substrate, the method comprising the steps of:
forming the upper electrode, the upper electrode being formed by:
forming a first upper electrode material on the substrate; and
forming a second upper electrode material on the first upper electrode material, the second upper electrode material having portions, each portion having a different thickness that corresponds to one of the R, G, B unit pixels,
wherein forming the second upper electrode material includes:
forming on portions of the first upper electrode material that corresponds to the R, G, B organic thin film layers, one or more first layers, each of the first layers having a different thickness that corresponds to one of the R, G, B unit pixels, respectively; and
forming a second layer in a uniform thickness on the first layer and the first upper is electrode material.

2. The method of claim 1, wherein the first layers for the R, G, and B unit pixels of the second upper electrode material are deposited using a fine metal mask so that each of the R, G, and B unit pixels has the different thickness.

3. The method of claim 1, wherein the first layers for the R, G, and B unit pixels of the second upper electrode material are patterned by three-time repetition of a photolithography so that each of the R, G, and B unit pixels has the different thickness.

4. The method of claim 1, wherein the first layers for the R, G, and B unit pixels of the second upper electrode material are patterned by a single photolithography process using a halftone mask so that each of the R, G, and B unit pixels has the different thickness.

5. The method of claim 1, wherein an emitting light is emitted in direction of the upper electrode.

6. A method of forming an organic light emitting device with R, G, B unit pixels, in which the R, G, B unit pixels comprise R, G, B lower electrodes formed on a substrate, R, G, B organic thin film layers each formed in the R, G, B lower electrodes, and an upper electrode formed over the substrate, the method comprising the steps of:
forming the upper electrode, the upper electrode being formed by:
forming a first upper electrode material on the substrate; and
forming a second upper electrode material on the first upper electrode material, the second upper electrode material having portions, each portion having a different thickness that corresponds to one of the R, G, B unit pixels,
wherein forming the second upper electrode material includes:
forming in a uniform thickness on the first upper electrode material a first layer; and
forming second layers for the R, G, B unit pixels on portions of the first layer that correspond to the R, G, B organic thin film layers, one or more second layers, so that each of the R, G, and B unit pixels has the different thickness.

7. The method of claim 6, wherein the second layers for the R, G, and B unit pixels of the second upper electrode material are deposited using a fine metal mask so that each of the R, G, and B unit pixels has the same thickness.

8. The method of claim 6, wherein the second layers for the R, G, and B unit pixels of the second upper electrode material are patterned by three-time repetition of a photolithography process so that each of the R, G, and B unit pixels has the different thickness.

9. The method of claim 6, wherein the second layers for the R, G, and B unit pixels of the second upper electrode material are patterned by a single photolithography process using a halftone mask so that each of the R, G, and B unit pixels has the different thickness.

10. The method of claim 6, wherein an emitting light is emitted in direction of the upper electrode.

* * * * *